United States Patent
Moors et al.

(10) Patent No.: US 7,515,245 B2
(45) Date of Patent: Apr. 7, 2009

(54) LITHOGRAPHIC APPARATUS AND DEVICE MANUFACTURING METHOD

(75) Inventors: Johannes Hubertus Josephina Moors, Helmond (NL); Vadim Yevgenyevich Banine, Helmond (NL)

(73) Assignee: ASML Netherlands B.V, Veldhoven (NL)

(*) Notice: Subject to any disclaimer, the term of this patent is extended or adjusted under 35 U.S.C. 154(b) by 116 days.

(21) Appl. No.: 10/942,102

(22) Filed: Sep. 16, 2004

(65) Prior Publication Data

US 2005/0083504 A1 Apr. 21, 2005

(30) Foreign Application Priority Data

Sep. 18, 2003 (EP) .................................. 03077957

(51) Int. Cl.
G03B 27/32 (2006.01)
G03B 27/42 (2006.01)

(52) U.S. Cl. .......................................... 355/53; 355/77

(58) Field of Classification Search .................. 355/67, 355/53, 77
See application file for complete search history.

(56) References Cited

U.S. PATENT DOCUMENTS

| | | | |
|---|---|---|---|
| 3,939,348 A | 2/1976 | Barrett | |
| 4,035,643 A | 7/1977 | Barrett | |
| 4,557,603 A * | 12/1985 | Oehler et al. | 356/418 |
| 4,622,845 A | 11/1986 | Ryan et al. | |
| 5,989,763 A | 11/1999 | Bendik et al. | |
| 6,147,351 A | 11/2000 | Huiku | |
| 6,538,716 B2 * | 3/2003 | Mulkens et al. | 355/30 |
| 6,781,669 B2 * | 8/2004 | Tanaka | 355/53 |
| 6,903,800 B2 * | 6/2005 | Onishi et al. | 355/53 |
| 2002/0018189 A1 * | 2/2002 | Mulkens et al. | 355/30 |
| 2004/0160583 A1 * | 8/2004 | Mulkens et al. | 355/30 |

FOREIGN PATENT DOCUMENTS

| | | |
|---|---|---|
| EP | 0 195 685 A2 | 9/1986 |
| EP | 0 195 685 A3 | 9/1986 |
| EP | 1 220 038 A1 | 7/2002 |
| JP | 61-258147 A | 11/1986 |
| JP | 64-41215 | 2/1989 |
| JP | 2001-110698 | 4/2001 |
| JP | 2002-158155 | 5/2002 |
| JP | 2002-270501 | 9/2002 |

OTHER PUBLICATIONS

Japanese Office Action issued for Japanese Patent Application No. 2004-270648, dated Aug. 13, 2007.
European Search Report for App. No. EP 03 07 7957 mailed Jul. 12, 2004, 3 pgs.
European Search Report for App. No. EP 04 07 7538 mailed Dec. 1, 2004, 3 pgs.

* cited by examiner

*Primary Examiner*—Rodney E Fuller
(74) *Attorney, Agent, or Firm*—Sterne, Kessler, Goldstein & Fox P.L.L.C.

(57) ABSTRACT

A lithographic apparatus is disclosed. The apparatus includes an illumination system for providing a beam of radiation, and a support structure for supporting a patterning device. The patterning device serves to impart the projection beam with a pattern in its cross-section. The apparatus also includes a substrate table for holding a substrate, a projection system for projecting the patterned beam onto a target portion of the substrate, an infrared radiation source for providing infrared radiation into a measurement zone within the lithographic apparatus, and a detector for receiving the infrared radiation from the infrared radiation source after having passed through the measurement zone, and for outputting a signal indicative of the presence of a gas present within the measurement zone.

20 Claims, 5 Drawing Sheets

LITHOGRAPHIC APPARATUS AND DEVICE MANUFACTURING METHOD

CROSS-REFERENCE TO RELATED APPLICATIONS

The present application claims the benefit of priority from European Patent Application No. 03077957.3, filed Sep. 18, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

To reduce the size of features that can be imaged using a lithographic apparatus, it is desirable to reduce the wavelength of the illumination radiation. Ultraviolet wavelengths of less than 180 nm are therefore currently used, for example, 157 nm or 126 nm. Also used are extreme ultraviolet (EUV) wavelengths of less than 50 nm, for example, 13.5 nm.

While gaseous contamination particles in lithographic apparatus continue to be a problem, it has been found that apparatus operating at shorter wavelengths, such as those less than 180 nm, are significantly more sensitive to the presence of contaminant particles than those operating at longer wavelengths. Contaminant particles such as hydrocarbon molecules and water vapor may be introduced into the apparatus from external sources, for example, gas supplies, wafers, or masks, or they may be generated within the lithographic apparatus itself, for example, by degassing of equipment.

It has been found that contaminant particles tend to adsorb to the optical components in the apparatus and cause a loss in transmission of the radiation beam. When using 157 nm or EUV radiation, a loss in transmission of about 1% is observed when only one or a few monolayers of contaminant particles form on the optical surfaces. Such a loss in transmission is unacceptably high. Further, the uniformity requirement of the projection beam intensity for such apparatus is less than 0.2%. Contamination compromises this requirement.

There is also a risk that the adsorption of contaminant particles on the surface of the optical components, or within the optical surface in the case of a porous surface, for example, an anti reflection coating, may cause damage to these optical components. Damage may occur if the optical components are suddenly irradiated with UV radiation, for example, 157 nm at a high power. The irradiation may cause rapid evaporation of the smaller contaminant particles, such as water molecules, which may be trapped within the porous surface of an optical component, thereby causing damage to the optical component itself. Such damage requires costly repair or replacement of components. Further, adsorption of contaminants to optical components such as reflectors and lenses (in lithographic apparatus operating a longer wavelengths) has been found to reduce the operating lifetime of such components. Further, cracking of molecules reduces the operating lifetime of components. For example, during EUV exposure, hydrocarbons are cracked to generate carbon which leads to build up of carbon layers on optical elements.

It is therefore desirable to monitor any gases, including contaminant gases, in a lithographic apparatus.

Previously, it has been proposed to monitor gases in lithographic apparatus using a known technique called residual gas analysis (RGA). A residual gas monitor is a mass spectrometer which first creates, then analyzes charged particles (ions) using either magnetic or electric fields to separate the ions of different masses. However, it has been found that RGA suffers drawbacks. The residual gas monitor generates heat, and such thermal disturbances in the apparatus may lead to imaging errors. Also, it is a necessary requirement of RGA that the analysis be implemented in situ, that is, in the volume in which the contaminants are originally found. Also, the measurements require a certain amount of time to complete, and are thus quite time consuming.

A further problem with RGA is that it cannot be exposed to high pressures. This limits the dynamical range of the RGA.

Another problem is that because RGA analyzes ions, and not complete molecules, the analysis may be difficult to interpret. A further drawback of the ionization process in RGA is that larger molecules are broken up. This drawback is a particular problem because it is desirable in lithographic apparatus, especially those operating at wavelengths shorter than 157 nm where contamination is a major concern, to identify the precise molecular structure of the contaminants in order to be able to identify their origin, and to be able to gain further insight into the contamination process, which at present is not fully understood. One consequence of having to break up larger molecules in RGA is that extensive calibration of the RGA apparatus is needed. The degree of ionization depends on the molecule and the RGA apparatus setting. To achieve accurate measurements of pressure, these should be calibrated. However, molecules are broken up into ions before they can be identified and measured, thereby adding complexity to the calibration of the RGA apparatus.

SUMMARY

It is an aspect of the present invention to address the problems encountered with detecting gases in a lithographic apparatus. In particular, it is an aspect of the present invention to provide a lithographic apparatus in which gaseous contaminants are detected and identified in a fast and non-destructive manner.

According to an aspect of the invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, a projection system for projecting the patterned beam onto a target portion of the substrate, an infrared radiation source for providing infrared radiation into a measurement zone within the lithographic apparatus, and a detector for receiving the infrared radiation from the infrared radiation source after having passed through the measurement zone. The detector outputs a signal indicative of the presence of a gas present within the measurement zone.

By using infrared radiation and a detector in the lithographic apparatus, the presence of gases may be detected a non-destructive way. Further, their presence may be found in a non-intrusive, continuous manner. Further, identification of contaminants follows in a fast manner, without requiring complex interpretation of the results. This is because a single signal may be produced, which may be provided as part of a time resolved spectrum in which each component of the spectrum corresponds to a particular gas. Further, the present invention has application over a wide dynamic range, and the detected signals do not suffer noise due to cross talk between different gases.

In an embodiment, the infrared radiation source includes a tunable infrared source that is tuned so that the wavelength of the radiation output by the infrared radiation source corresponds to the wavelength absorbed by at least one of a predetermined gas or gases. By tuning the source to output a wavelength of a predetermined gas, the detection is designed to be highly selective and accurate in its identification of gases.

In an embodiment, the infrared radiation source includes a plurality of the tunable infrared sources, respectively tuned to a plurality of wavelengths corresponding to a plurality of predetermined gases. By providing a plurality of infrared sources tuned to a plurality of predetermined wavelengths corresponding to known gases, a time resolved spectrum may be produced in which the presence of all the predetermined contaminants is provided. In this way, the application of the infrared absorption apparatus may be adapted to the very specific conditions found in a lithographic apparatus and other apparatus where highly selective and accurate identification are desired.

In an embodiment, the measurement zone is provided with at least one optical element which is disposed for causing the infrared radiation to follow a path having a path length longer than one of the dimensions of the measurement zone. By providing a path length longer than a dimension of the measurement zone along which the infrared radiation passes, a more accurate assessment of the presence of a particular gas may be made, because the path length is proportional to the adsorption of radiation by a particular gas. Thus, the longer the path length, the greater the absorption, and the greater the difference between a test radiation beam and a control radiation beam, and the higher the sensitivity will be.

In an embodiment, the detector is arranged to detect the presence of a gas or gases in the projection system. By detecting the presence of a gas in the projection system, the conditions within which the highly expensive optical elements operate may be closely monitored.

In an embodiment, a control circuit is provided that is responsive to the detector, and arranged so that if a measured partial pressure of the gas or at least one of the gases exceeds a predetermined threshold, the control circuit generates a control signal to prevent the illumination system from providing the projection beam of radiation. In this way, if a threshold partial pressure of a potentially damaging gas is measured, damage to the projection system may be avoided.

In an embodiment, the optical element or elements disposed in the measurement zone is/are included in the projection system. In this way, convenient incorporation of the measurement zone may be achieved, because existing structures (in particular mirrors) in the projection system may be used. Further, the infrared radiation may be introduced into the projection system using existing structures provided in the supporting frame of the projection system, such as holes provided to allow the projection beam to enter, or holes provided in the supporting frame through which certain systems are evacuated. Thus, the incorporation of the infrared radiation source, measurement zone, and detector is both easy to facilitate and does not compromise the structural integrity of the supporting frame of the projection system, which should be both thermally and mechanically stable.

In an embodiment, the lithographic apparatus includes a substrate handling apparatus for supplying a substrate to the substrate table, wherein the detector is arranged to detect the presence of a gas or gases in the substrate handling apparatus. It has been found that the substrate handling apparatus is a major source of gases, in particular contaminating gases, in the lithographic apparatus. Thus, by identifying the presence of gases in the substrate handling apparatus, a major source of contaminants may be monitored.

In an embodiment, a control circuit responsive to the detector is arranged so that if a measured partial pressure of a gas or at least one of the gases exceeds a predetermined threshold, the control circuit may generate a control signal to prevent the substrate handling apparatus from supplying a substrate to the substrate table. By preventing the substrate handling apparatus from supplying a substrate to the substrate table when the partial pressure of a gas exceeds a threshold level, the amount of, in particular contaminating, gases introduced to the projection system may be reduced, and even prevented.

In an embodiment, the detector may be arranged to measure the partial pressure(s) of a contaminant gas or contaminant gases in the lithographic apparatus. By measuring the partial pressure of contaminating gases, the level of contamination may be assessed to avoid damage to the lithographic apparatus.

According to a further aspect of the invention, there is provided a device manufacturing method that includes providing a substrate, providing a beam of radiation using an illumination system, using a patterning device to impart the beam of radiation with a pattern in its cross-section, projecting the patterned beam of radiation onto a target portion of the substrate, providing infrared radiation into a measurement zone within the lithographic apparatus, receiving the infrared radiation after the infrared radiation has passed through the measurement zone, and outputting a signal indicative of the presence of a gas present within the measurement zone.

In an embodiment, a device manufacturing method is provided. The method includes patterning a beam of radiation with a patterning device, projecting the patterned beam of radiation onto a target portion of a substrate, detecting a gas present within a measurement zone within a lithographic apparatus by passing infrared radiation through the measurement zone and receiving the infrared radiation after the infrared radiation has passed through the measurement zone with a detector, and outputting a signal indicative of the presence of the gas present within the measurement zone.

According to a further aspect of the present invention, there is provided an infrared radiation source for use in an infrared absorption apparatus for a lithographic apparatus. The infrared radiation source includes a tunable infrared source that is tuned so that the wavelength of the radiation output by the infrared radiation source corresponds to the wavelength absorbed by at least one of a predetermined or likely predetermined gas or gases.

In an embodiment, the infrared radiation source includes a plurality of the tunable infrared sources that are tuned to a plurality of wavelengths corresponding to a plurality of predetermined or likely predetermined gases. By providing tunable sources, a highly selective infrared absorption apparatus may be provided, which may be designed to meet the requirements of any particular application. It will be understood that although hereinbelow the application of the infrared radiation source in a lithographic apparatus is described in detail, the infrared radiation source of the present invention is not limited to this particular application, but has application to other apparatus, for example, apparatus where a highly selective source for accurate identification of gases known from a predetermined range of gases may be necessary.

According to an aspect of the present invention, there is provided an infrared absorption apparatus for a lithographic apparatus. The infrared absorption apparatus includes a measurement zone within the lithographic apparatus, an infrared radiation source for providing infrared radiation into the measurement zone, and a detector for receiving the infrared radiation from the infrared radiation source after having passed through the measurement zone, and for outputting a signal indicative of the presence of a gas within the measurement zone.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as needed and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
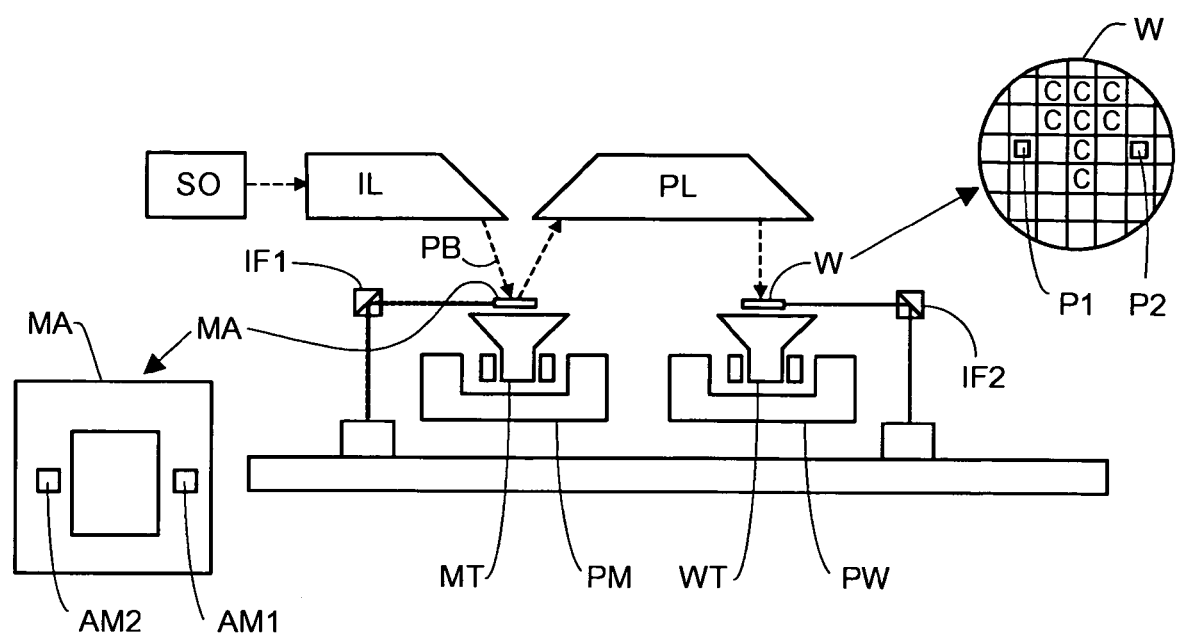
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV or EUV radiation), a first support structure (e.g. a mask table) MT for supporting a patterning device (e.g. a mask) MA and connected to a first positioning device PM for accurately positioning the patterning device MA with respect to item PL, a substrate table (e.g. a wafer table) WT for holding a substrate (e.g. a resist-coated wafer) W and connected to a second positioning device PW for accurately positioning the substrate with respect to item PL, and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases, the source may be integral part of the apparatus, for example, when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator IL provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks AM1, AM2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as necessary after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In embodiments of the present invention, infrared radiation is used to identify the presence of a gas in the projection system PL and the substrate handling apparatus. However, it is understood that the present invention may be used to identify the presence of gas in other components of the apparatus. The present invention may also be applied simultaneously at different locations within the apparatus. In such cases, the data processing, discussed hereinbelow, may be carried out locally at each location within the apparatus, or centrally within or remote from the apparatus. In an embodiment, the present invention identifies the presence of a contaminating gas in the lithographic apparatus. However, the invention is not limited in this respect and the radiation may be used to detect the presence of other gases which may be introduced for a particular reason into the lithographic apparatus. One further advantage of using infrared radiation to detect the presence of a gas in a lithographic apparatus is that infrared radiation is not absorbed or scattered by nitrogen gas, which is used to purge certain lithographic apparatus. In such apparatus it is not necessary to detect the presence of nitrogen. Thus, the signal output by the detector achieved using the present invention should not suffer any background noise due to the detection of purging nitrogen. This allows detection of other gases, in particular contaminating gases, to be carried out more accurately.

Figure 2:
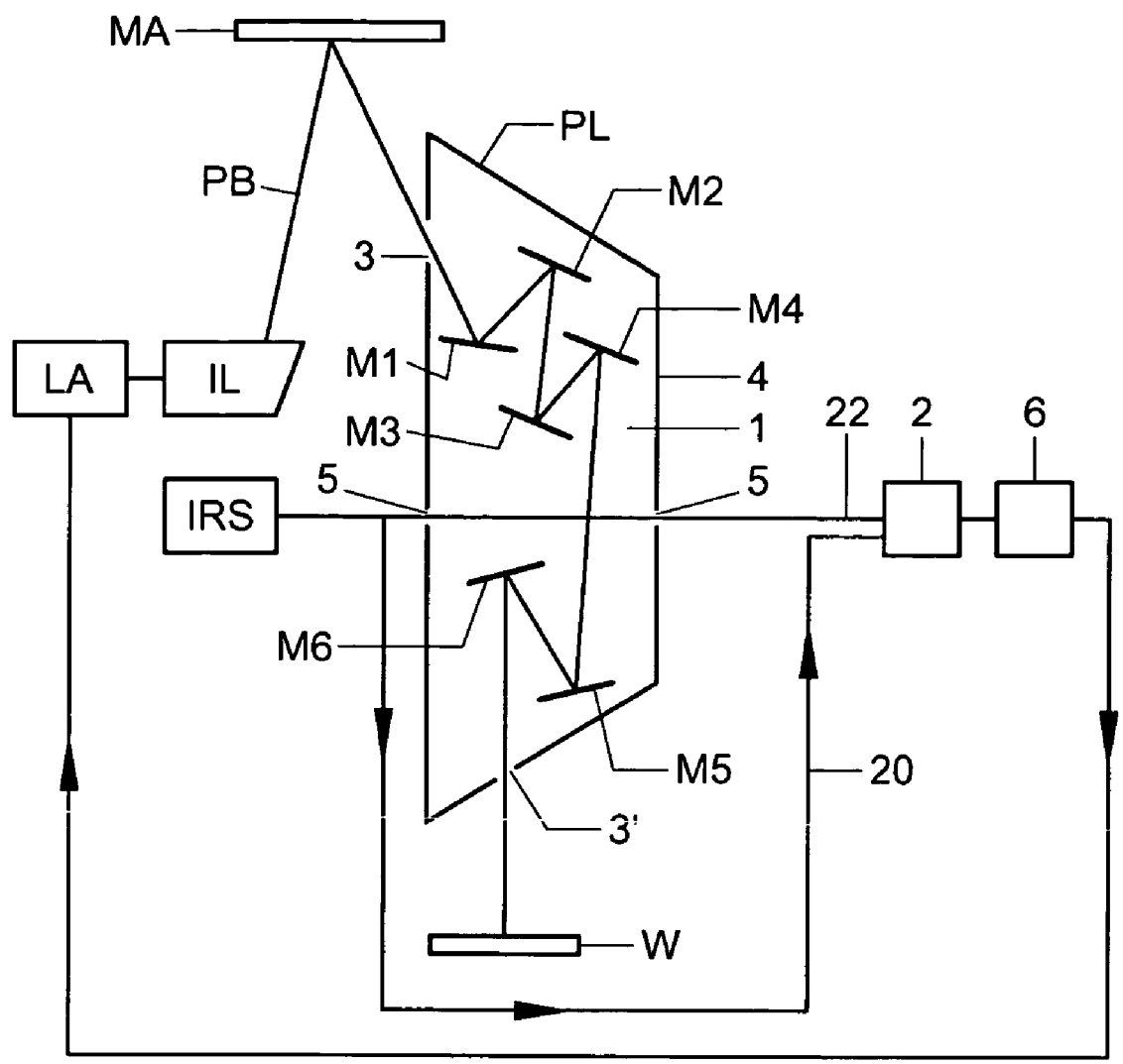
FIG. 2 depicts details of the lithographic apparatus of FIG. 1 that includes an infrared absorption apparatus according to an embodiment of the present invention.

FIG. 2 depicts details of a lithographic apparatus that includes an infrared absorption apparatus according to an embodiment of the present invention. For those elements having the same reference numeral as elements shown and described with reference to FIG. 1, FIG. 1 is referred to. The projection system PL typically includes a supporting frame 4 on which a plurality of optical elements, typically mirrors M1-M6, are disposed. The projection beam PB enters the projection system PL via an opening 3 formed in the supporting frame 4 and follows a path defined by mirrors M1-M6 before leaving the projection system PL via opening 3'. In the embodiment depicted in FIG. 2, an infrared absorption apparatus IRS, 2, 6 is provided. The principles of infrared gas absorption analysis are, as such, known, and are described, for example, in U.S. Pat. No. 3,939,348, incorporated herein by reference. In particular, the bonds within any molecule rotate and vibrate at specific frequencies. Generally, vibrational frequencies lie in the infrared region. Therefore, by irradiating molecules with infrared radiation, those molecules having a vibrational frequency corresponding to the wavelength of the radiation will absorb photons. As a result, the transmitted intensity of the radiation passed through a measurement zone 1, 100 should be less. The greater the concentration, or partial pressure of the molecule in the measurement zone, the greater the absorption. Thus, by measuring the amount of absorption, the partial pressure of the absorbing molecule may be established. Therefore, by using infrared absorption, the presence of molecules may be detected, and their partial pressure determined. In particular, according to an embodiment of the present invention, the infrared wavelength emitted or detected may be tuned such that a vibrational-rotational transition in certain molecules is excited, for example, the C—C bond in a hydrocarbon molecule.

The infrared radiation source IRS may be a broadband emitter which provides radiation of a range of wavelengths, or may provide radiation of a single, or a narrower range of wavelengths. Preferably, the source is adjustable so that it can be tuned to different wavelengths. Filters may also be used to select desired wavelengths. Typical sources include a solid state diode, which may be tunable, a hot object, for example, a band lamp, or a laser, for example, a helium neon (HeNe) laser. In order to reduce any thermal load on the system in which the analysis takes place, the source may be disposed behind a pin hole (not shown). Suitable wavelengths or ranges of wavelengths for the infrared radiation fall within the range of about $0.3$ $cm^{-1}$ to about $4600$ $cm^{-1}$, typically from about $400$ $cm^{-1}$ to about $4600$ $cm^{-1}$. In one embodiment, a contaminant molecule is identified and its partial pressure is measured by irradiating it with infrared radiation characteristic of the vibrational frequency of that molecule, or of a bond within that molecule. For example, when considering vibrational excitation, an alkyl C—H bond has a stretching frequency in the range of about $2800$ $cm^{-1}$ to about $3000$ $cm^{-1}$ and an O—H bond has a stretching frequency in the range of about $2800$ $cm^{-1}$ to about $3800$ $cm^{-1}$. The precise frequency of each vibration in any given molecule will be determined by a number of factors, such as steric influences, and non-covalent bonding, such as hydrogen bonding. The predominant factor contributing to the precise frequency is the molecular structure of the particular molecule. Approximate frequencies for a variety of chemical bonds are given in the table below:

TABLE 1

| Vibration | Frequency ($cm^{-1}$) |
|---|---|
| O—H | 2800–3800 |
| O—H (Si—OH) | 3800 |
| OH (Si—OH) | 4600 |
| C—H | 2960 |
| C—C | 900 |
| C=C | 1650 |
| C=O | 1700 |
| S=O | 1310 |
| C—F | 650 |
| Si—Si | 430 |

Infrared radiation of one of the above specific frequencies, or a range of frequencies including one of the above frequencies, may therefore be used to excite a molecule containing the corresponding type of bond. While Table 1 gives a list of absorbed frequencies, the present invention also may be used to detect scattered frequencies of infrared radiation. The frequencies of scattered radiation will differ from the absorbed frequencies discussed above, but may also be used in the same way to detect a particular gas.

Many of the contaminant molecules present in a lithographic apparatus contain O—H bonds, for example, water and alcohols, and therefore a suitable range of frequencies is from about $2800$ $cm^{-1}$ to about $3800$ $cm^{-1}$. The vibration frequency of water is at the upper end of this range, so to identify the presence and measure the partial pressure of water vapor, a frequency of about $3500$ $cm^{-1}$ to about $3800$ $cm^{-1}$ may be used. Similarly, other contaminants may be identified, and their partial pressures may be measured by providing radiation having a frequency which corresponds to a vibration frequency of the relevant contaminant. Several frequencies may be irradiated in turn or simultaneously, such that several different contaminants may be identified and analyzed either in series or parallel.

As shown in FIG. 2, the infrared absorption apparatus IRS, 1, 2, 100 may be incorporated in the lithographic apparatus that is shown in FIG. 1. In one embodiment, windows 5 are provided in the supporting frame 4, through which the infrared radiation passes into measurement zone 1. The windows may be formed especially for this purpose, however alternatively, existing holes or windows in the supporting frame 4 may be used. In one embodiment, openings 3,3' may also be used to introduce infrared radiation into the measurement zone 1. In such an embodiment, the mirrors M1-M6 may be used to reflect the infrared radiation. This particular arrangement may be advantageous, because it increases the path length of the IR radiation, the significance of which is described hereinbelow with respect to FIGS. 4a and 4b. Alternatively, the provision of additional optical elements in the measurement zone 1, 100 is also envisaged in order to increase the path length of the radiation through the measurement zone 1, 100. In the embodiment shown in FIG. 2, the infrared radiation source IRS is seen to be aligned with a detector 2. However, this is not essential. Neither is it essential that the IR source have any particular directionality. The detector 2 detects IR radiation 22 incident on it, and analyzes the wavelength and intensity of the incident radiation. The output of the detector 2 will depend on the particular analysis needed, however, it may include a time resolved spectrum. From this output, spectral components may be identified as corresponding to specific gases, by referring to the wavelength components of the spectrum. The partial pressure of each gas is determined in accordance with the intensity of the relevant wavelength components. In order to calibrate the detector 2, a calibration signal 20, including an infrared beam which has not been passed through the measurement zone, is supplied from the source IRS to the detector 2. This may be achieved using, for example, an optical fiber or other optical transmitting device. For example, the signal 20 may be applied via free space, where the apparatus configuration allows. In an embodiment, as also shown in FIG. 2, a control loop may be used to provide a control signal to the radiation system LA to prevent the radiation system from providing a radiation beam PB in the case where a detected partial pressure of a contaminant gas exceeds a predetermined threshold. To this end, a control circuit 6 is coupled between the detector 2 and the radiation system LA. The control circuit 6 is responsive to the detector 2, and arranged so that if the measured partial pressure of the contaminant exceeds a predetermined threshold, the control circuit generates a control signal to prevent the radiation system LA from providing the projection beam of radiation.

The location of the source IRS and the detector 2 is not essential to the invention. In an embodiment, the source IRS and/or the detector 2 may be disposed within an evacuated region (as may be the case, for example, in a lithographic apparatus operating in the EUV range) or, alternatively, the source IRS and/or the detector 2 may be disposed outside the apparatus. In this alternative embodiment, windows, such as, for example, calcium fluoride or quartz windows, may be provided in the apparatus in order to allow the radiation to enter and leave the apparatus. In an embodiment, independent of whether the detector is disposed within or outside the apparatus, in order to reduce noise levels in the detector 2, the detector 2 may be cooled using, for example, liquid nitrogen or a peltier element.

Figure 3:
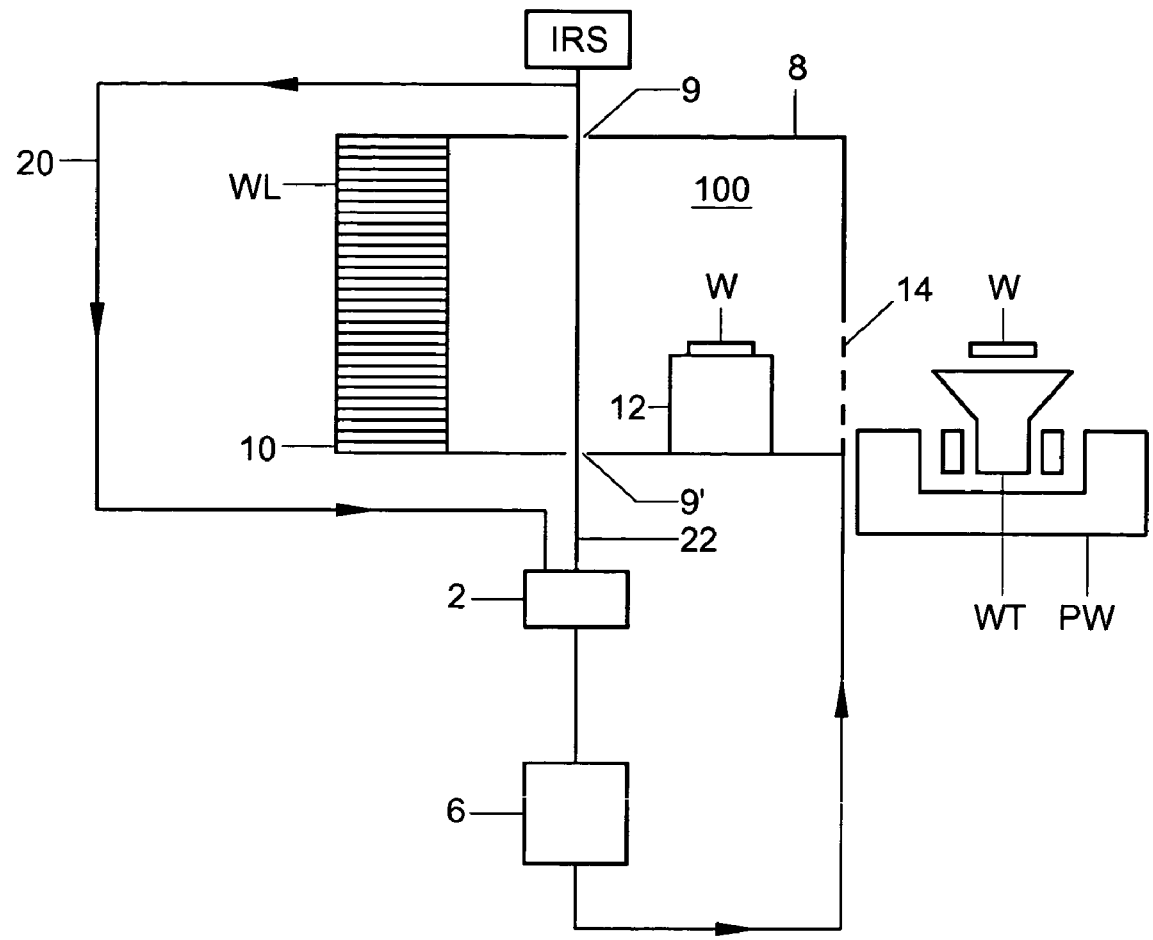
FIG. 3 depicts details of the lithographic apparatus of FIG. 1 that includes an infrared absorption apparatus according to an embodiment of the present invention.

FIG. 3 depicts details of a lithographic apparatus that includes an infrared absorption apparatus according to an embodiment of the present invention. In the embodiment shown in FIG. 3, the same principles are applied as in the embodiment shown in FIG. 2. Reference is made to FIG. 2 for such principles. In addition, for those components depicted in FIG. 3 having the same reference numerals as components shown in FIG. 2, reference is also made to FIG. 2. FIG. 3 shows a wafer (substrate) library WL including a substrate handling apparatus 12 for supplying a substrate W to wafer table WT. The wafer library WL includes a housing 8 in which a plurality of wafers 10 for exposure are stored prior to their exposure. The substrate handling apparatus 12 selects a wafer W from the library. The selected wafer W is then supplied via gate 14 to the wafer table WT. The gate 14 is generally kept closed during operation, and is only opened in order to allow a wafer W to be supplied to the wafer table WT. The infrared absorption IRS, 2, 100 is carried out using a source, as previously described. The IR radiation is provided into the measurement zone 100 via a window 9 provided in the housing 8. Having entered the measurement zone 100, the radiation exits the housing 8 via a window 9'. The windows 9,9' are preferably airtight, and include an IR transmissive material. As with the embodiment in shown in FIG. 2, although the windows are shown to be aligned, this is not essential. In a further embodiment, optical elements, such as reflectors and prisms (not shown) may be disposed in the housing in order to increase the path length along which the IR radiation passes. The detector 2, a control loop that includes a control circuit 6, a detected beam 22, and a calibration signal 20 function and serve the same purpose, respectively, as those similarly numbered components shown in FIG. 2, except that the control circuit 6 responsive to the detector 2 is arranged so that if the measured partial pressure of an contaminant exceeds a predetermined threshold, the control circuit 6 generates a control signal to prevent the substrate handling apparatus 12 from supplying a substrate W to the substrate table WT. Alternatively, the similar arrangement of an IR source and a detector as shown in FIG. 3, may be adapted for use in a patterning device handling apparatus, such as a mask library. As far as contamination is concerned, the same applies to the patterning device (masks) as applies to substrates (wafers). In particular, masks may also degas water or hydrocarbons depending on how they are stored or handled. Thus, the present invention also has application to mask libraries. In such an embodiment, the IR source is disposed to pass a beam of IR radiation through the mask library. The IR detector is disposed to receive radiation that has passed through the library. The detection is carried out as described with respect to the other embodiments.

Figure 4A:
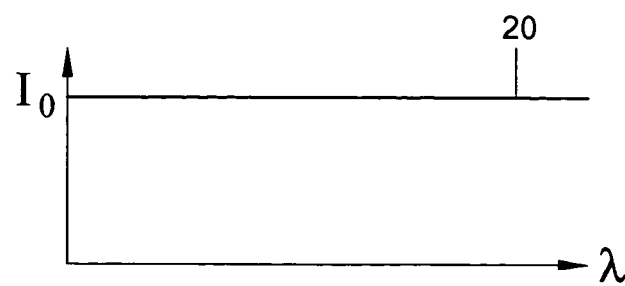
FIG. 4a depicts a plot of infrared intensity against wavelength of a calibration signal for use in the detection according to an embodiment of the present invention.
Figure 4B:
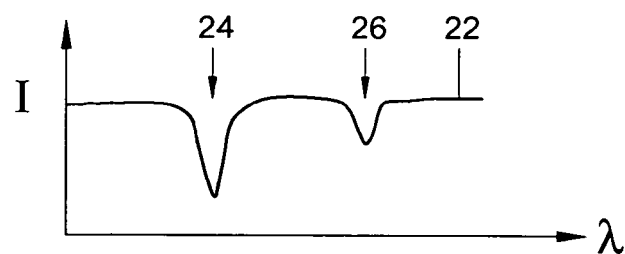
FIG. 4b depicts a plot of infrared intensity against wavelength of a detected signal detected by a detector according to an embodiment of the present invention.

FIG. 4a depicts a plot of infrared intensity against wavelength of a calibration signal 20 for use in the detection according to an embodiment of the present invention and FIG. 4b depicts a plot of infrared intensity against wavelength of a detected signal 22 detected by detector 2 according to an embodiment of the present invention. The calibration signal 20 originates from the infrared radiation source and represents the wavelength distribution of and respective intensities of the radiation emitted by the source. Although calibration signal 20 is depicted as a straight line, this is not necessarily the case, and the signal will vary depending on the particular source. The intensity of certain wavelengths may be higher or lower than other wavelengths. Further, as discussed below with reference FIG. 5, the source may be adapted to provide a range of specific wavelengths having a precisely defined wavelength and relatively high intensity. A calibration signal is provided to the detector 2 for a representative plurality of the wavelengths emitted by the source. It is not necessary that a calibration signal 20 be provided for each wavelength emitted by the source. The detected beam 22 is that detected by the detector 2 has passed through the measurement zone 1, 100. Depending on the gases present in the measurement zone 1, 100, certain wavelength components of the infrared radiation are absorbed, which reduces the intensity of the detected beam at these particular wavelengths. In the example shown in FIG. 4b, the absorbed wavelengths are those corresponding to troughs 24 and 26. The shape of the trough will vary depending of various factors. For example, at low pressure, the width of the trough is narrower, and at higher temperatures, the width of the trough is broader, while the depth remains constant. These observations also follow Lambert Beer's law, discussed below.

The present invention may be used to detect a partial pressure of a gas in the lithographic apparatus, and the partial pressure may be detected to high degrees of accuracy. The pressure within a projection system in a lithographic apparatus operating in the EUV bandwidth is typically $10^{-3}$ mbar. The partial pressure of contaminants such as water and a variety of hydrocarbons, are typically $10^{-7}$ and $10^{-9}$ mbar, respectively.

The relation between partial pressure and the absorption in the center of the absorption lines 24, 26 is given by Lambert Beer's law:

$$I/I0 = \exp(-a * l * p) \qquad \text{(equation 1)},$$

where l is the length of the path the infrared radiation passes through the measurement zone and p is the partial pressure to be measured. The constant a is the strength of the absorption line, and depends on the gas that absorbs the radiation and on the particular line which is being observed. As mentioned, the width of the absorption line depends on the temperature of the absorbing gas, due to the Doppler effect, and on the total pressure. It is noted that even at 0 Kelvin at 0 Pascals pressure, the trough has a natural line width.

Figure 6:
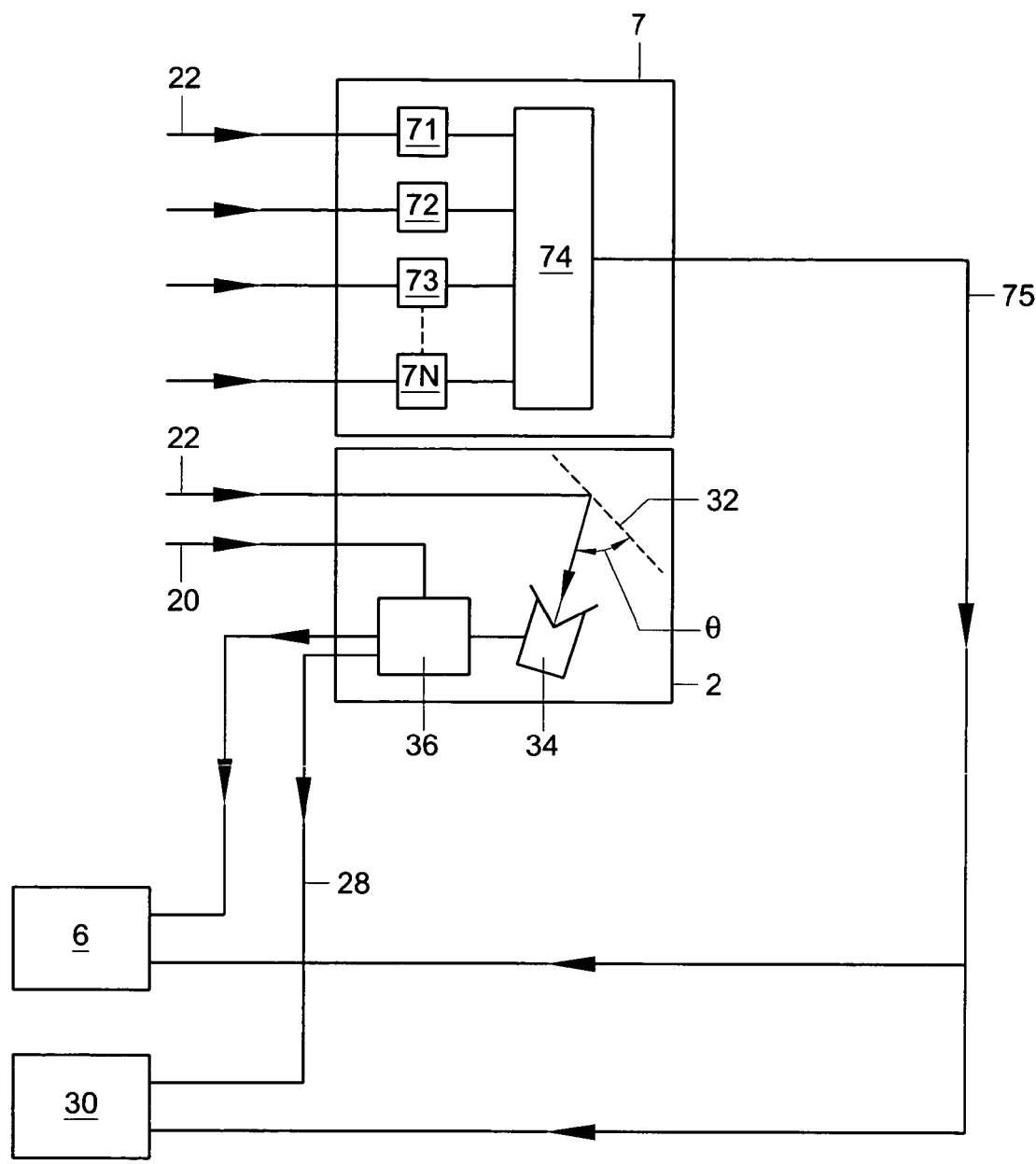
FIG. 6 depicts details of an infrared detector of the lithographic apparatus according to an embodiment of the present invention.

In addition to measuring the partial pressure of a gas in the system, once a particular gas has been identified using the present invention, a data processor 36, as shown in FIG. 6, may be used to further determine the temperature in the system and the total pressure in the system.

Figure 5:
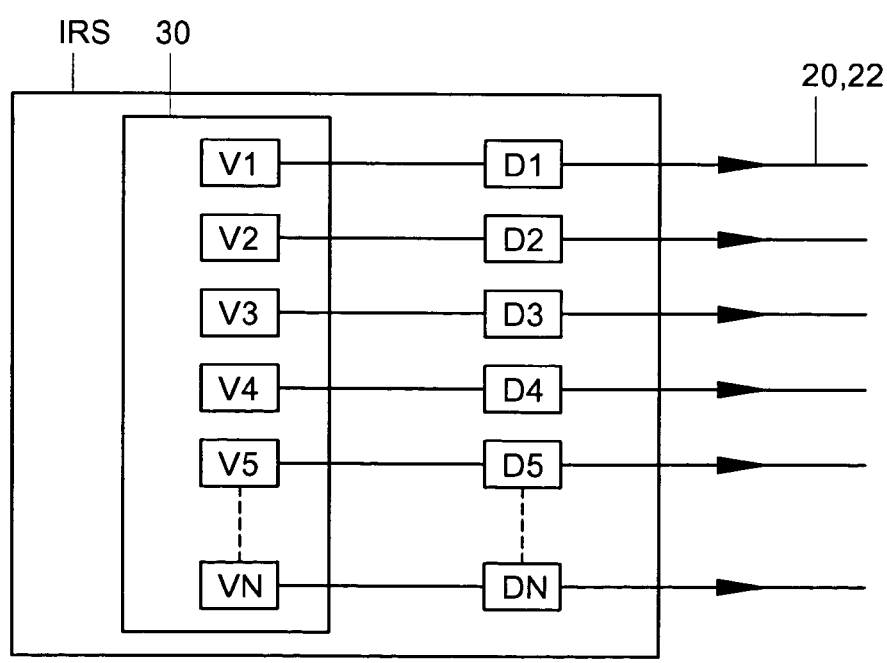
FIG. 5 depicts details of an infrared radiation source of the lithographic apparatus of FIG. 1 according to an embodiment of the present invention.

FIG. 5 depicts details of an infrared radiation source according to an embodiment of the present invention. In certain embodiments of the present invention, the presence of particular gases is detected. For example, some of the gases, in particular certain contaminants, should be closely monitored in the lithographic apparatus, as their presence may be highly damaging to apparatus components and the imaging process. In order to target specific gases, the source may be adapted accordingly. By adapting the source, the detection may be highly selective and accurate. For such purposes, a tunable infrared source has been developed. Such a source, as shown in FIG. 5, includes at least one diode D1-DN. Each diode is modulated to emit radiation 20, 22 of a particular wavelength. Depending on certain factors, such as the wavelength to be emitted, different diodes may include different semiconductor materials. The modulator 30 includes at least one voltage source V1-VN which applies a voltage to the or each diode D1-DN, respectively. The modulator 30 controls the voltage applied to each diode in such a way that the radiation emitted by the diode or diodes has a wavelength which can be controlled to the order of picometers ($10^{-12}$ m). This allows specific gases, including contaminants, to be directly targeted. If such an arrangement of diodes is used, and the path length in the measurement zone is arranged to be sufficiently long, the detected signal 22 may exhibit very strong absorption troughs, which may allow properties such as the partial pressure to be determined accurately to an order of magnitude of $10^{-9}$ mbar, as is needed by lithographic apparatus operating in vacuum conditions. The diodes may be cooled.

In addition, or alternatively, the source may include a broadband radiation source. If it is uncertain which gases are present in the lithographic apparatus, a broadband infrared radiation source may be used. The detected signal 22 may then be analyzed to determine the gases present in the apparatus on the basis of the absorption data contained in the detected signal. Once the presence of a particular gas has been determined, the modulator 30 tunes a diode to provide radiation having the appropriate wavelength in order to more accurately assess the partial pressure of the particular gas. If a gas is detected for the first time, this data gives insight into possible contamination processes that may occur in the lithographic apparatus. Further, a wavelength selector, such as a monochromator, may be provided to tune the wavelength of the source output by a diode, or diodes, for subsequent measurements at a particular wavelength to be carried out.

FIG. 6 depicts details of an infrared detector according to an embodiment of the present invention. In an embodiment, a detector 2 receives the signal 22 to be detected. The calibration signal 20 is input directly to a data processing element 36. The calibration signal 20 is compared in the data processing element to the detected signal 22 to obtain an indication of the relative absorption of particular wavelengths. The signal to be detected is received by the detector 2. A detecting device 32, 34, such as a diffraction grating 32, and an angle and intensity measuring device 34 are arranged so that the signal to be detected is incident on the diffraction grating 32. In the embodiment shown, the diffraction grating 32 is shown as a reflective grating, however, it may also be transmissive. By measuring the angle at which the signal is reflected by the grating, the wavelength of the light present in the detected signal is detected using Bragg's Law, $$2d \sin \theta = m \lambda \quad \text{(equation 2)},$$

where d is the spacing between lines on the diffraction grating 32, theta is angle of reflection (or transmission if a transmission grating is used), and m is the order of the diffracted spectrum. The intensity of the signal is measured using a conventional intensity measuring circuit (not shown).

The data derived from the detected signal is provided to data processing element 36, which determines the gas(es) present and other parameters such as its partial pressure, and the temperature and total pressure in the lithographic apparatus. In addition to providing a signal to the control circuit 6 described above, the data processing element 36 may also provide a signal 28 to the modulator 30 to cause the modulator to tune a diode, or a plurality of diodes, to a particular wavelength, as ascertained by the data processor corresponding to a wavelength absorbed (or scattered) by a particular gas to be targeted during further measurements. Optionally, a second detector 7 may also be provided. The purpose of the second detector 7 is to provide a reference signal 75, which is fed to the control circuit 6 and the modulator 30. The reference signal 75 generated by the second detector 7 may also be used to calibrate the detector 2. The second detector 7 is arranged to receive the signal 22 to be detected and includes at least one reference cell 71, 72, 73, 7N. The reference cells 71, 72, 73, 7N include closed chambers having IR transparent windows through which the signal 22 to be measured passes. The chambers are filled with known quantities of gases, such as water vapor. The reference cells may be filled with the same or differing gases. While the second detector 7 may be disposed adjacent the first detector 2, this is not essential, provided the second detector 7 is arranged to receive IR radiation that has passed through the measurement zone 1. In particular, when the second detector 7 is disposed outside the lithographic apparatus, the second detector 7 may be used to ascertain the gases present in a fast manner. Also provided in the second detector 7 is a processing unit 74, which processes the output of the reference cells 71-7N.

While specific embodiments of the invention have been described above, it will be appreciated that the invention may be practiced otherwise than as described. The description is not intended to limit the invention.

What is claimed is:
1. A lithographic apparatus comprising:
an illumination system configured to provide a beam of radiation;
a support structure configured to support a patterning device, the patterning device serving to impart the beam of radiation with a pattern in its cross-section;
a patterning device handling apparatus constructed and arranged to supply said patterning device to said support structure;
a substrate table configured to hold a substrate;
a substrate handling apparatus constructed and arranged to supply said substrate to said substrate table;
a projection system configured to project the patterned beam onto a target portion of the substrate;
an infrared radiation source configured to provide infrared radiation into a measurement zone, said measurement zone being defined by at least two surfaces of and located within said projection system, at said patterning device handling apparatus, or at said substrate handling apparatus, wherein the infrared radiation propagates along a distance corresponding to at least a length of a dimension of said projection system, a dimension of said patterning device handling apparatus, or a dimension of said substrate handling apparatus; and
a detector configured to receive said infrared radiation from said infrared radiation source after said infrared radiation has passed through said measurement zone, said detector outputting a signal indicative of the presence of a gas within said measurement zone.

2. The apparatus of claim 1, wherein said infrared radiation source comprises a tunable infrared source being tuned so that the wavelength of the radiation output by said infrared radiation source corresponds to the wavelength absorbed by at least one of a predetermined gas or gases.

3. The apparatus of claim 2, wherein said infrared radiation source comprises a plurality of said tunable infrared sources being tuned to a plurality of wavelengths corresponding to a plurality of predetermined gases.

4. The apparatus of claim 1, wherein said measurement zone is provided with at least one optical element which is disposed for causing said infrared radiation to follow a path having a path length longer than one of the dimensions of said measurement zone.

5. The apparatus of claim 4, wherein said optical element is within said projection system.

6. The apparatus of claim 1, wherein said detector is arranged to detect the presence of at least one gas in said projection system.

7. The apparatus of claim 6, further comprising a control circuit, responsive to said detector, arranged so that if a measured partial pressure of said at least one gas exceeds a predetermined threshold, said control circuit generates a control signal to prevent said illumination system from providing said beam of radiation.

8. The apparatus of claim 1, wherein said detector is arranged to detect the presence of at least one gas in said substrate handling apparatus.

9. The apparatus of claim 8, further comprising a control circuit, responsive to said detector, arranged so that if a measured partial pressure of said at least one gas exceeds a predetermined threshold, said control circuit generates a control signal to prevent said substrate handling apparatus from supplying said substrate to said substrate table.

10. The apparatus of claim 1, wherein said detector is arranged to detect the presence of at least one gas in said patterning device handling apparatus.

11. The apparatus of claim 10, further comprising a control circuit, responsive to said detector, arranged so that if a measured partial pressure of said at least one gas exceeds a predetermined threshold, said control circuit generates a control signal to prevent said patterning device handling apparatus from supplying said patterning device to said support structure.

12. The apparatus of claim 1, wherein said detector is arranged to measure a partial pressure of at least one contaminant gas in said lithographic apparatus.

13. The apparatus of claim 1, wherein the infrared radiation source, or the detector or both are located outside the projection system.

14. The apparatus of claim 1, wherein the infrared radiation propagates in the projection system without being enclosed in the measurement zone.

15. The apparatus of claim 1, wherein the infrared radiation source, or the detector or both are located outside a region where a gas to be detected is located.

16. The apparatus of claim 1, wherein the projection system defines an enclosure in which the patterned beam is directed, the infrared radiation source, or the detector or both located outside the enclosure.

17. A device manufacturing method comprising:
    patterning a beam of radiation with a patterning device;
    projecting the patterned beam of radiation onto a target portion of a substrate with a projection system;
    detecting a gas present within a measurement zone defined by at least two surfaces of and located i) within the projection system, ii) at a patterning device handling apparatus constructed and arranged to supply said patterning device to a support structure, or iii) at a substrate handling apparatus constructed and arranged to supply said substrate to a substrate table within a lithographic apparatus by passing infrared radiation though the measurement zone, wherein the infrared radiation propagates along a distance corresponding to at least a length of a dimension of said projection system, a dimension of said patterning device handling apparatus, or a dimension of said substrate handling apparatus;
    receiving said infrared radiation after said infrared radiation has passed though said measurement zone; and
    outputting a signal indicative of the presence of the gas present within said measurement zone.

18. An infrared absorption apparatus for a lithographic apparatus, said infrared absorption apparatus comprising:
    a measurement zone defined by at least two surfaces of and located i) within a projection system, ii) at a patterning device handling apparatus, or iii) at a substrate handling apparatus within the lithographic apparatus;
    an infrared radiation source configured to provide infrared radiation into said measurement zone, wherein the infrared radiation propagates along a distance corresponding to at least a length of a dimension of said projection system, a dimension of said patterning device handling apparatus. or a dimension of said substrate handling apparatus; and
    a detector configured to receive said infrared radiation from said infrared radiation source after having passed though said measurement zone, said detector outputting a signal indicative of the presence of a gas within said measurement zone.

19. The apparatus of claim 18, wherein said infrared radiation source comprises a tunable infrared source being tuned so that the wavelength of the infrared radiation output by said infrared radiation source corresponds to the wavelength absorbed by at least one predetermined gas.

20. A lithographic apparatus comprising:
    an illumination system configured to provide a beam of radiation;
    a support structure configured to support a patterning device, the patterning device serving to impart the beam of radiation with a pattern in its cross-section;
    a patterning device handling apparatus constructed and arranged to supply said patterning device to said support structure;
    a substrate table configured to hold a substrate;
    a substrate handling apparatus constructed and arranged to supply said substrate to said substrate table;
    a projection system configured to project the patterned beam onto a target portion of the substrate;
    an infrared radiation source configured to provide infrared radiation into a measurement zone defined by at least two surfaces of and located i) within said projection system, ii) at said patterning device handling apparatus, or iii) at said substrate handling apparatus, wherein the infrared radiation propagates along a distance corresponding to at least a length of a dimension of said projection system, a dimension of said patterning device handling apparatus, or a dimension of said substrate handling apparatus;
    a detector configured to receive said infrared radiation from said infrared radiation source after said infrared radiation has passed though said measurement zone, said detector outputting a signal indicative of the presence of at least one gas within said measurement zone; and a control circuit, responsive to said detector, arranged so that if a measured partial pressure of said at least one gas exceeds a predetermined threshold, said control circuit generates a control signal to prevent said illumination system from providing said beam of radiation, or to prevent said substrate handling apparatus from supplying said substrate to said substrate table, or to prevent said patterning device handling apparatus from supplying said patterning device to said support structure.

* * * * *

UNITED STATES PATENT AND TRADEMARK OFFICE
CERTIFICATE OF CORRECTION

| | |
|---|---|
| PATENT NO. | : 7,515,245 B2 |
| APPLICATION NO. | : 10/942102 |
| DATED | : April 7, 2009 |
| INVENTOR(S) | : Johannes Hubertus Josephina Moors |

Page 1 of 1

It is certified that error appears in the above-identified patent and that said Letters Patent is hereby corrected as shown below:

In column 16, line 30, "though said measurement zone" should be --through said measurement zone--.

Signed and Sealed this

Sixteenth Day of June, 2009

JOHN DOLL
*Acting Director of the United States Patent and Trademark Office*